(12) United States Patent
Wu et al.

(10) Patent No.: US 7,800,392 B2
(45) Date of Patent: Sep. 21, 2010

(54) DETECTION CONTROL CIRCUIT FOR ANTI-LEAKAGE

(75) Inventors: Jia-Hsuan Wu, Hsinchu (TW); Chuen-An Lin, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 186 days.

(21) Appl. No.: 12/264,400

(22) Filed: Nov. 4, 2008

(65) Prior Publication Data

US 2010/0085072 A1 Apr. 8, 2010

(30) Foreign Application Priority Data

Oct. 3, 2008 (TW) .............................. 97138246 A

(51) Int. Cl.
*G01R 31/26* (2006.01)
(52) U.S. Cl. ....................................... 324/765; 324/763
(58) Field of Classification Search ........................ None
See application file for complete search history.

(56) References Cited

U.S. PATENT DOCUMENTS 7,411,409 B2 * 8/2008 Klass et al. .................. 324/765

* cited by examiner

*Primary Examiner*—Minh N Tang
(74) *Attorney, Agent, or Firm*—WPAT, PC; Justin King

(57) ABSTRACT

The present invention discloses a detection control circuit for preventing a leakage current, which comprises a register unit comprising a clock signal input terminal for receiving a clock signal; a reset signal input terminal, for receiving a reset signal; a signal generating terminal, for generating a logic signal; and a logic gate, coupled to said register unit, comprising a first signal input terminal for receiving said logic signal; a second signal input terminal for receiving a control signal; and a signal output terminal, for outputting an output signal according to said logic signal and said control signal; wherein said control signal controls said logic gate so as to keep said output signal to be in a fixed state which detects a leakage current in an integrated circuit due to the process flaw.

6 Claims, 3 Drawing Sheets

DETECTION CONTROL CIRCUIT FOR ANTI-LEAKAGE

BACKGROUND OF THE INVENTION

1. Field of the Invention

Figure 1:
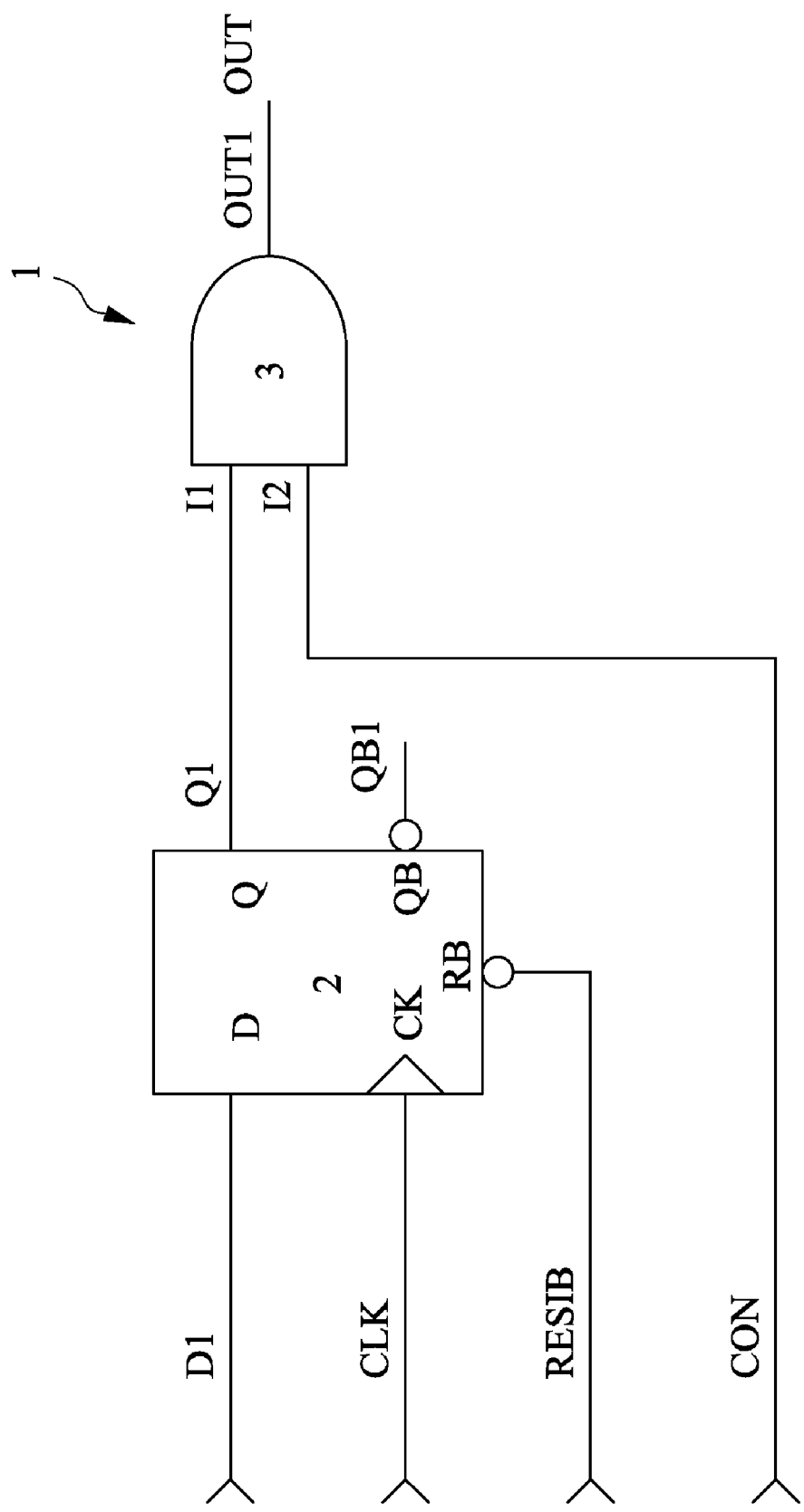

The present invention relates to a detection control circuit for anti-leakage, more particularly to, a detection control circuit for preventing from leakage current in an integrated circuit due to process flaw.

2. Description of the Prior Arts

A digital circuit is no more than a combination of some registers (e.g., latches, D Flip-flops) and combinational logics. Due to the process flaw for some nodes in the circuit there will be a leakage current. Under the normal operation, the leakage current is not eminent so the same will not be hurt. However, while the circuit enters a standby mode, the effect of leakage current makes the energy storage apparatus inevitable and shortens its life period. What makes things worse is, such defects are randomly distributed in the circuit. When the circuit enters the standby mode, all of the registers' and the combinational logics' states are determined by their default values of registers. Suppose there are totally 20 registers, then the possible kind of combination will be 2048. And each of combinations needs to be set in the corresponding standby mode so as to detect the arising spot for leakage current, besides, according to the complexity for the modern integrated circuits; the registers are far beyond said 20. Hence, to detect the defect caused by process flaw or the current leakage at standby situation will be an extremely difficult and uneconomically engineering according to teachings disclosed by the prior art.

Accordingly, in view of the above drawbacks, it is an imperative that an anti-leakage detection control circuit is designed for the leakage in an integrated circuit by process flaw so as to solve the drawbacks as the foregoing.

SUMMARY OF THE INVENTION

In view of the disadvantages of prior art, the primary object of the present invention relates to a detection control circuit for anti-leakage, and the corresponding purpose is to detect the leakage current phenomenon in an integrated circuit due to process flaw.

According to one aspect of the present invention, one skilled in the art can understand a detection control circuit for preventing a leakage current, which comprises a register unit comprising a clock signal input terminal for receiving a clock signal; a reset signal input terminal, for receiving a reset signal; a signal generating terminal, for generating a logic signal; and a logic gate, coupled to said register unit, comprising a first signal input terminal for receiving said logic signal; a second signal input terminal for receiving a control signal; and a signal output terminal, for outputting an output signal according to said logic signal and said control signal; wherein said control signal controls said logic gate so as to keep said output signal to be in a fixed state which detects a leakage current in an integrated circuit due to the process flaw.

The present invention effectively provides a solution for preventing the leakage at the time of standby period where the register numbers are exceedingly high and only a few of fixed combinations are formed.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

THE BRIEF DESCRIPTION OF THE DRAWINGS

Figure 2:
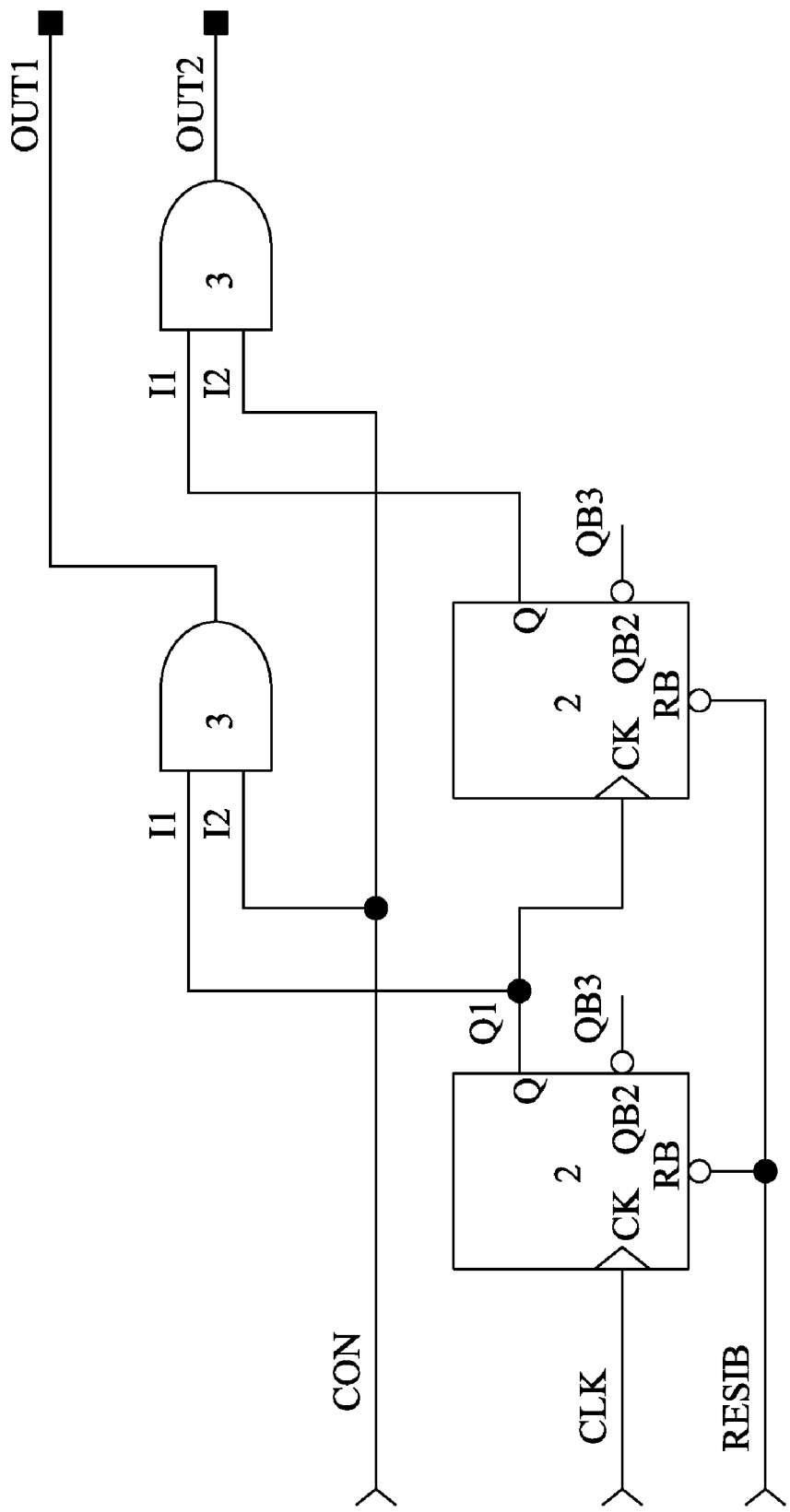
Figure 3:
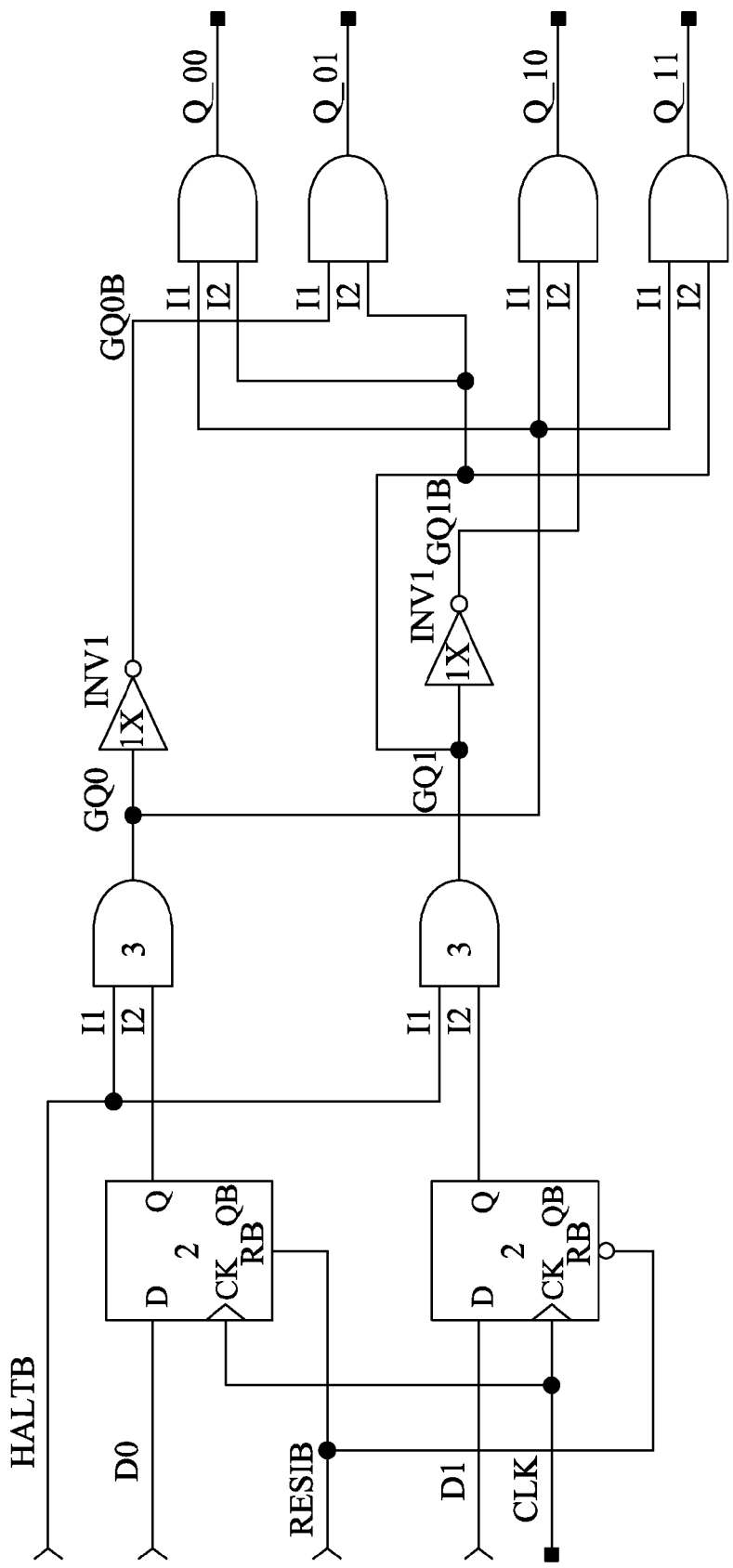

The present invention will become readily understood from the detailed description given herein below and the accompanying drawings which are given by way of illustration only, and thus are not limitative of the present invention and wherein:

FIG. 1 relates to an anti-leakage detection control circuit of a preferred embodiment according to the present invention;

FIG. 2 relates to an anti-leakage detection control circuit of another preferred embodiment according to the present invention; and FIG. 3 relates to an anti-leakage detection control circuit of still another preferred embodiment according to the present invention.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

FIG. 1 relates to a preferred embodiment as a detection control circuit for anti-leakage according to the present invention. Referring to FIG. 1 now, a detection control circuit 1 for anti-leakage comprises: a register unit 2, which comprises a clock signal input terminal CK, for receiving a clock signal CLK, where said register unit 2 can be a latch, a D flip-flop, or a T flip-flop. And the present preferred embodiment illustrates a D flip-flop in the detection control circuit where said D flip-flop comprises a data signal input terminal D, for receiving a data signal D1 and said D flip-flop further comprising an inverted signal generating terminal QB for generating an inverted logic signal QB1; a reset signal input terminal RB, for receiving a reset signal RESIB; a signal generating terminal Q, for generating a logic signal Q1; and a logic gate 3, said logic gate 3 is coupled to said register unit 2 and comprises a first signal input terminal I1 for receiving said logic signal Q1; a second signal input terminal I2, for receiving a control signal CON, where said control signal CON can be a standby signal or a testing signal; and a signal output terminal OUT, for outputting an output signal OUT1 based upon said logic signal Q1 and said control signal CON; wherein, said control signal CON controls said logic gate 3 so as to affixed said output signal OUT1 to be a fixed state (Such as state 0 or state 1) for detecting a leakage in an integrated circuit due to the process flaw.

FIG. 2 relates to another preferred embodiment as a detection control circuit for anti-leakage according to the present invention. Referring to FIG. 2 now, which explains the situation at the time of the combination of two sets of detection control circuits, and in this embodiment a T flip-flop is recited. Said T flip-flop comprises an inverted signal generating terminal QB2, for generating an inverted logic signal QB3. Hence, based upon the statement specified by the above specification, a person skilled in the ordinary art should be able to realize as long as all the registers in the integrated circuit (such as latches, D flip-flops, or T flip-flops) are accompanied with the detection control circuit disclosed in the present invention, while the integrated circuits enter a standby mode, since the contents in all of the registers are locked as a stable values, then the subsequent combinational logic states will be affixed to be a combination so as to detect the leakage phenomenon due to the process flaw in such a combination. And if the process flaw happens at a different state combination of registers, since the outputs of registers are locked by the standby signals, there will be no leakage occurs. As to the process flaw happening at the registers themselves, since registers are controllable themselves, as long as all of registers are all set to be 0 and the corresponding standby current is tested, and then all registers are set to be 1 and again the corresponding standby current is tested, the defects or flaw can be easily located.

The control signal CON depicted in FIG. 1 and FIG. 2, is controlled by standby signal, in addition, is controlled by tested signal, because under some circumstances not all of registers and counters are controlled by standby signal (e.g., input/output interfaces, real-time clock counters . . . etc). Hence, at the standby state, registers not controlled by standby signal still forms a number of combination, however, according to the same situation under an appropriate testing mode, together with standby mode, the circuit combination can still be affixed to be a fixed combination and detects to see if there is leakage issue to be addressed by testing apparatus.

FIG. 3 relates to another preferred embodiment as a detection control circuit for anti-leakage according to the present invention. Referring to FIG. 3 now, which explains at the time of the combination of two sets of detection control circuits the application to outputs for more practical circuits' logics. In the present preferred embodiment, when standby signal HALTB=1, the possible combinations for the data signal D0 and D1 are specified as the follows:

| Data Signals D0, D1 | Output Signals GQ0, GQ1 | Ultimate outputs Q_00, Q_01, Q_10, Q11 |
| --- | --- | --- |
| 00 | 00 | 1, 0, 0, 0 |
| 01 | 01 | 0, 1, 0, 0 |
| 10 | 10 | 0, 0, 1, 0 |
| 11 | 11 | 0, 0, 0, 0 |

When standby signal HALTB=0, the possible combinations for the data signal D0 and D1 are specified as the follows:

| Data Signals D0, D1 | Output Signals GQ0, GQ1 | Ultimate outputs Q_00, Q_01, Q_10, Q_11 |
| --- | --- | --- |
| 00 | 00 | 1, 0, 0, 0 |
| 01 | 00 | 1, 0, 0, 0 |
| 10 | 00 | 1, 0, 0, 0 |
| 11 | 00 | 1, 0, 0, 0 |

Hence, from the disclosures of the above statement, even though there is leakage under the standby mode, at the ultimate output side there will be no power consumption for the integrated circuit so a number of combinations can be shrink to a testable range such that the integrated circuit with leakage can be detected at an allowable price.

From the above statement, a person skilled in the ordinary art can clearly understand the present invention provides a detection control circuit for anti-leakage, which can address the issue of the astronomical number of register when integrated circuits are staying in the standby mode and shrink the corresponding huge range to a fixed combination and effectively detects the defective integrated circuit and prevent the leakage current at the standby mode for the same.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A detection control circuit for anti-leakage, comprising:
   a register unit, comprising
      a clock signal input terminal for receiving a clock signal;
      a reset signal input terminal, for receiving a reset signal; and
      a signal generating terminal, for generating a logic signal; and
   a logic gate, coupled to said register unit, comprising
      a first signal input terminal for receiving said logic signal;
      a second signal input terminal for receiving a control signal; and
      a signal output terminal, for outputting an output signal according to said logic signal and said control signal;
      wherein said control signal controls said logic gate so as to keep said output signal to be in a fixed state which detects a leakage current in an integrated circuit due to the process flaw.

2. The circuit as set forth in claim 1, wherein said register unit is selected from the group of a latch, a D flip-flop, or a T flip-flop.

3. The circuit as set forth in claim 2, wherein said D flip-flop comprises a data input terminal for receiving a data signal.

4. The circuit as set forth in claim 2, wherein said D flip-flop comprises an inverted signal-generating terminal for generating an inverted logic signal.

5. The circuit as set forth in claim 1, wherein said control signal is selected from a standby signal or a testing signal.

6. The circuit as set forth in claim 2, wherein said T flip-flop comprises an inverted signal-generating terminal for generating an inverted logic signal.

* * * * *